United States Patent
Sunderland

(10) Patent No.: US 7,398,735 B1
(45) Date of Patent: Jul. 15, 2008

(54) BERNOULLI TYPE, NON-CONTACT AIR-ACTIVATED LIFTING AND TAMPING DEVICE

(76) Inventor: Howard F. Sunderland, 12750 Centralia St., Unit 113, Lakewood, CA (US) 90715

(*) Notice: Subject to any disclaimer, the term of this patent is extended or adjusted under 35 U.S.C. 154(b) by 371 days.

(21) Appl. No.: 11/303,384

(22) Filed: Dec. 16, 2005

(51) Int. Cl.
*E01B 27/00* (2006.01)

(52) U.S. Cl. .......................................... 104/10; 104/12

(58) Field of Classification Search ............ 104/10, 104/12; 404/103, 107, 108; 53/527, 529, 53/530
See application file for complete search history.

(56) References Cited

U.S. PATENT DOCUMENTS

| | | | |
|---|---|---|---|
| 3,992,905 A | * | 11/1976 | Oberley et al. ............... 68/241 |
| 3,997,278 A | * | 12/1976 | Riedl ....................... 404/133.1 |
| 4,476,786 A | * | 10/1984 | Theurer ........................ 104/12 |
| 5,768,988 A | * | 6/1998 | Meloni ......................... 53/527 |
| 5,987,857 A | * | 11/1999 | Haddow et al. ............... 53/527 |
| 6,389,979 B1 | * | 5/2002 | Theurer et al. ................ 104/10 |

* cited by examiner

*Primary Examiner*—Lars A Olson
(74) *Attorney, Agent, or Firm*—Timothy Thut Tyson; Freilich, Hornbaker & Rosen

(57) ABSTRACT

A non-contact, air-activated lifting and tamping device which incorporates a means of producing a Bernouilli airflow at the device nozzle, creating an adjacent low air pressure region for inducing lift; and which includes provision for high velocity air jets for tamping operation. The device is compact, never clogs or ices and is easily adjustable for a wide range of applications.

5 Claims, 5 Drawing Sheets

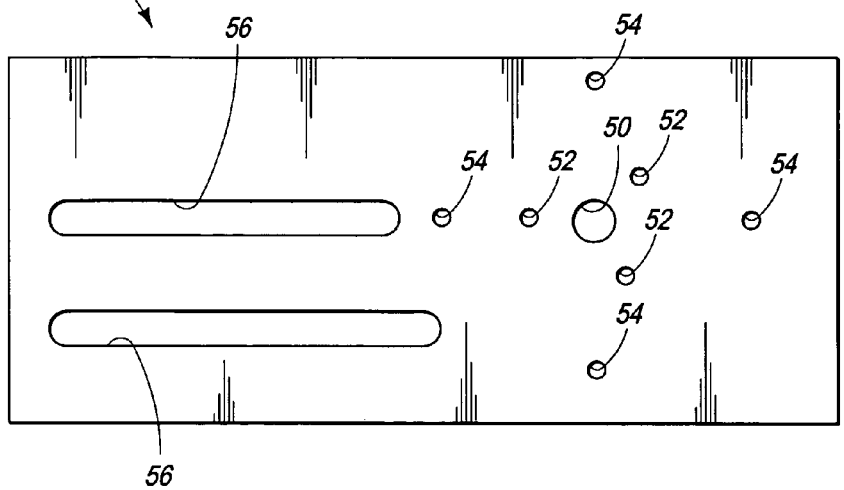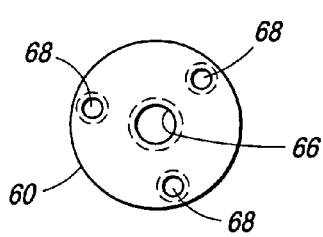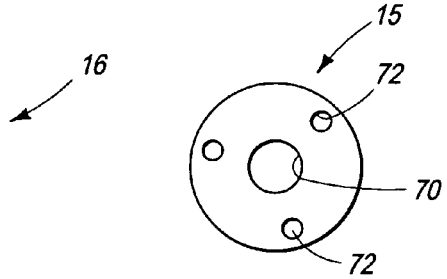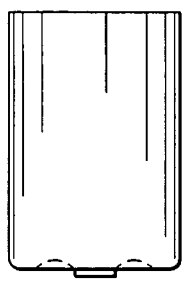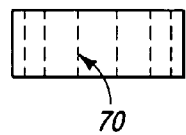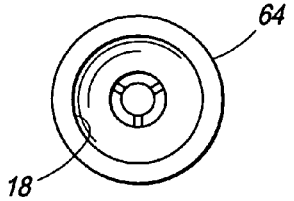

BERNOULLI TYPE, NON-CONTACT AIR-ACTIVATED LIFTING AND TAMPING DEVICE

BACKGROUND OF THE INVENTION

1. Field of the Invention

This invention relates to apparatus used in industrial automated assembly line and packaging operations, and more particularly, to machines that use pneumatics for picking up and placing small, light weight parts.

2. Background

A number of pneumatic prior art devices are presently used for picking up and placing small, light weight items; particularly items such as labels for automated labeling of packages or containers.

A typical current device uses a box with a screen on the bottom and a suction fan on the top to hold a label prior to dispensing with a blast of air. The box is very bulky and is designed to be fixed to a label machine, making it difficult to conform the device to other applications. An electric fan motor, is also a potential fire hazard in some industrial environments.

Another device uses a Venturi vacuum generator to create a low pressure in a suction cup. The difference between the low pressure created by the Venturi and the atmospheric pressure presses the part to be lifted into the suction cup. A blast air supply for tamping may be attached.

Both types of devices contact the lifted parts, if only briefly. Both types of devices also may be characterized as having holding periods which include times for the suction or vacuum level to build up and to decay, allowing a machine to initiate a following step. Thus, for these types of lifting/tamping devices, there is a minimum lifting time that can not be shortened to increase item processing speed.

Some problems that are common to the known devices are:
- damage to or distortion of items held to the device during lift periods;
- clogging of suction openings with debris;
- leakage of air into Venturi suction cups, or leakage of suction air resulting in failure to lift a part;
- failure to lift parts having perforations;
- difficulty in adjustment for varied part applications; and,
- much down time for routine maintenance.

The present invention device incorporates a simple design that does not contact lifted items, solves these problems and greatly reduces device and installation costs.

SUMMARY OF THE INVENTION

The invention is a non-contact, lifting and tamping device that is fastened to a mounting plate and is totally air-activated. A cylindrical shell and a generally cylindrical nozzle member disposed in the shell, are combined to form an annular air chamber which includes at a bottom end, an array of high velocity air jet holes for jet air tamping. A Bernouilli type airflow generator is incorporated axially in the device to provide a lifting force at the nozzle. In operation, sequenced activations of a regulated high pressure air hose and a blast air pressure hose connected to the device, will produce a sequence of a lift force between the nozzle center and circumference, followed by a tamping force that is applied by a circle of high velocity air jets. The device is compact; does not contact processed lifted items and has no moving parts.

Accordingly, it is a prime object of this invention to provide a lifting and tamping device that never clogs or requires maintenance.

Another object is to provide a lifting and tamping device that is easily adjustable for a wide range of applications, both in clean or dirty environments.

Yet another object is to greatly improve the speed of processing using the invention lifting and tamping device.

An advantage of the invention over the prior art devices is its significantly lower installation cost.

Further objects and advantages of the invention will be apparent from studying the following portion of the specification, the claims and the attached drawings.

BRIEF DESCRIPTION OF THE DRAWINGS

FIGS. 8 and 9 are respectively: a plan view and an end view of a mounting plate;

FIGS. 10A, 10B, and 10C are respectively, a top end view, a side elevation view and a bottom end view of a commercially available Bernoulli lift generator unit; and FIGS. 11A and 11B, are respectively, an end plan view and a side elevation view of a lift generator unit spacing disk.

DESCRIPTION OF THE PREFERRED EMBODIMENT

The invention is a non-contact, lifting and air-tamping device that is totally air-activated, and is intended primarily for use in automated systems which handle light weight items.

Figure 1:
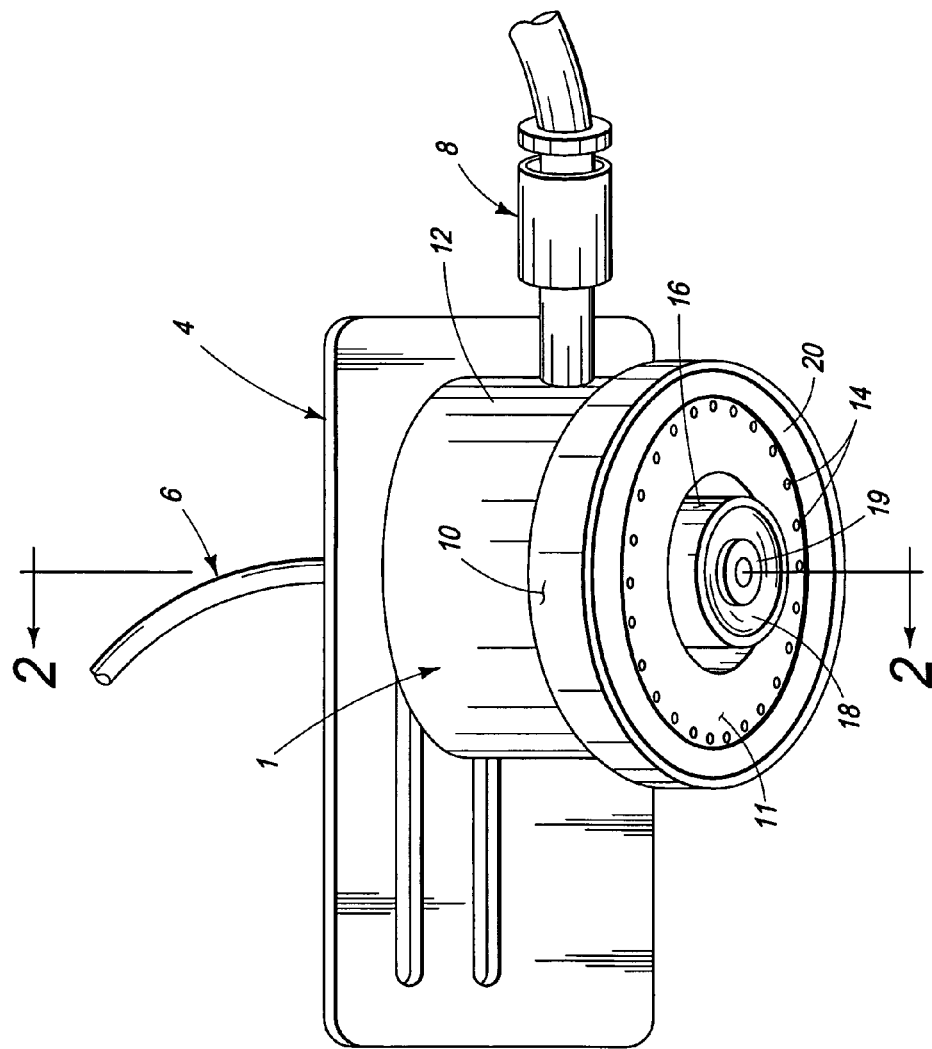
FIG. 1 is a perspective view of a preferred embodiment of a non-contact, air-activated lifting and tamping device according to the present invention, particularly showing the device mounted, with connected input high pressure air hoses and ready for operation.
Figure 2:
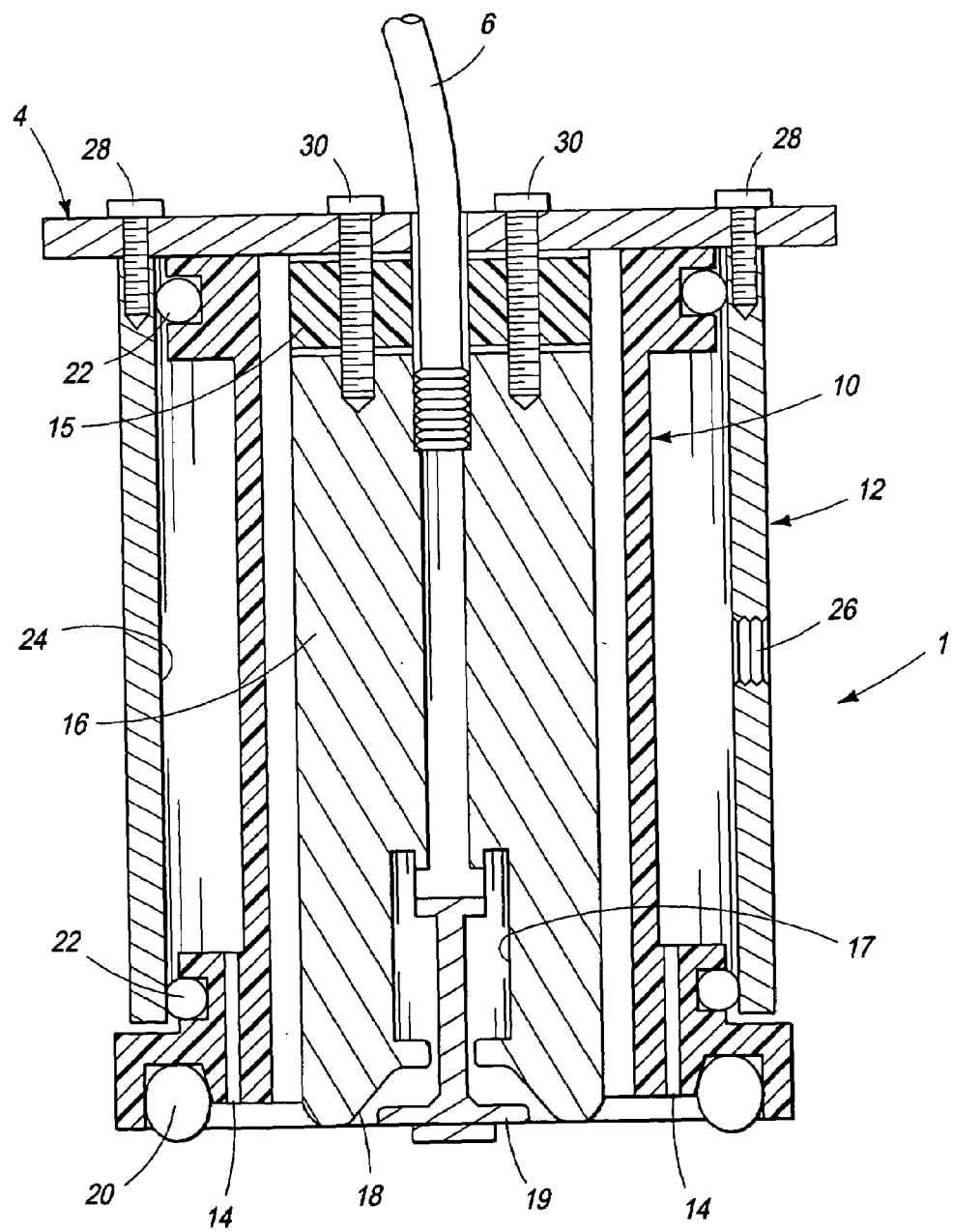
FIG. 2 is an axial cross-section elevation view of the device, taken along line 2-2 of FIG. 1, and particularly showing a central Bernoulli type lift generator unit, an annular blast air chamber created by a shell wall and a nozzle insert assembly that houses the lift generator unit, and multiple vertical blast air jet passages around the blast air chamber bottom for air jet tamping through the nozzle face below.

Referring particularly to the drawings, there is shown in FIGS. 1 and 2 respectively, a perspective view of the preferred embodiment of an invention device 1 fastened to an equipment mounting plate 4, and a cross-section view of the device 1 and mounting plate 4, taken along line 2-2 of FIG. 1

These views show the device construction and also aid in understanding how the device operates which is now described.

The lifting/air-tamping device 1 is fastened to a flat-sided mounting plate 4, which, in use, would be attached to an automated handling machine. Two high pressure air hoses from the automated handling machine are then connected to the device 1. These are: a regulated, high air pressure hose 6 which is connected input to a device top opening, and a blast air hose 8 which is connected input to a port in the device shell 12. In operation, the automated handling machine activates the air hoses 6, 8 by means of computer controlled pulses when so required. For example, suppose a flat, light weight item such as a paper label, is brought immediately below and opposite the device nozzle face 11, or the device is moved to an equivalent position.

A short (<0.03 sec.) pulse of regulated high pressure air is applied through the top center of the device and into the center of a Bernouilli lift generator unit 16. The fast air pulse travels through an axial tube and a split-direction cavity 17, and exits at a recessed nozzle opening 18 in a horizontal, radially extending stream of high velocity air.

The high velocity air flow across the device face 11 produces a low pressure between the label surface and the device nozzle, which generates a force in the direction from the higher air pressure on the other side of the label to the lower pressure region. This phenomenon is often referred to as the Bernouilli effect in fluid mechanics. As a result, the label is lifted and held close to, but not in contact with an annular ring 20 that is embedded in a flange at the nozzle end of the device. The label remains lifted only for the duration of the air pulse.

To tamp the label in place on a container after a lift air pulse is shut off, a short pulse of high pressure air is applied by a blast air hose 8 through a side port opening 26 in the shell 12. The blast air fills an annular, cylindrical cavity 24 which is formed by a generally cylindrical nozzle insert sleeve member 10 and the shell 12 wall that surrounds it. The blast air exits through a multiple number of vertical, narrow tubular passages 14 that are cut in a stepped flange that is located at the lower end of the nozzle insert sleeve member 10, and produces a circle of high velocity air jets. These air jets together apply force to a label surface, which immediately tamps the label to a container surface.

It should be noted that at no time does the device contact an item that is lifted and air-tamped. This is due to the air film and flow that separates the device from an item being handled. There are applications such as in laboratory work, where this attribution may be critical.

Operating speed for industrial assembly and processing should be greatly enhanced by use of the device. As an example, in a demonstration using the invention device, the above described operation for lifting and applying a label took place in less than 5/100th of a second (<0.05 sec.). This time is an order of magnitude less than the best time for prior art labeling devices.

Items weighing up to 2 lb. (0.9 kg.) can be lifted and transported, depending on the size and lift rating of the invention device, and the compressed air supplied by a handling machine. Thus it is clear that the above described handling of labels is only one of many possible applications for the invention lifting and air-tamping device.

Refer now to FIG. 2. All the assembled device components can be seen in this cross-section view. The components include: an equipment mounting plate 4; a cylindrical metal shell 12; a nozzle insert assembly comprising a sleeve member 10, two "O" rings 22, and a large elastomer tamp ring 20; a Bernouilli lift generator unit 16 which is located inside the sleeve member 10 central cavity, and a plastic spacing disk 15 which is located above the lift generator unit 16. The "O" rings 22 are placed in a groove around a flange that is located at each end of the sleeve member 10 to provide for an air tight fit when the nozzle insert assembly is placed inside the shell 12 as shown in FIG. 2. An annular tamp ring 20 serves to stabilize any delicate item that may be lifted by the device. The spacing disk 15 ensures that the nozzle end 19 of the Bernouilli lift generator unit 16 is placed precisely in a particular plane that is required for correct device operation.

Means for fastening the shell 12 and the lift generator unit 16 to the mounting plate 4 includes the use of screws or a suitable strong adhesive. In the preferred embodiment, the device shell 12 is shown fastened to a mounting plate 4 by means of four threaded screws 28, while the lift generator unit 16 is fastened by means of three threaded screws 30 to the mounting plate 4 through holes in the spacing disk 15.

Figure 3:
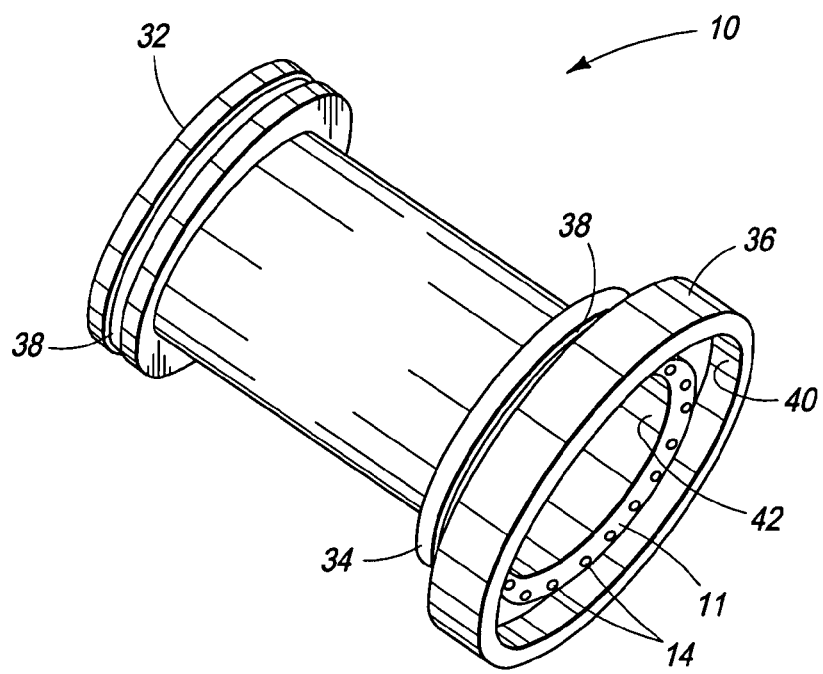
FIG. 3 is a perspective view of a nozzle insert assembly sleeve member, showing a ring of blast air passage holes located on an annular end rim surrounding the sleeve member central axial cavity.

A perspective view of the sleeve member 10 of the nozzle insert assembly, is shown in FIG. 3. The sleeve member 10 is fabricated of molded plastic material and has an axial longitudinal central cavity 42 extending throughout. A first flange 32 extends radially outward at the cavity top opening, and a stepped second flange 36 extends radially outward at a distal end of the sleeve member.

The first flange 32 includes a circumferential deep groove 38 which is sized to seat an O-ring, as does the second flange 36. However, the second flange groove 38 is cut in the side of an upper step portion 34 of the second flange 36. This upper step portion 34 is made to have the same diameter as the first flange 32, in order achieve a good fit when the sleeve member with O-rings in place, is inserted into the shell 12.

The stepped second flange 36 has a multiple number of small diameter air passages that are cut longitudinally, and which are disposed spaced apart in a ring that is concentric with the sleeve member axial cavity opening 42. These air passages have exit openings 14 in an annular nozzle face 11 of the sleeve member 10, and serve to emit high velocity air jets when the device is activated. A deep, wide annular third groove 40 is formed in the recessed nozzle face 11 to seat a large elastomer ring that serves as a tamp ring 20.

Figure 4:
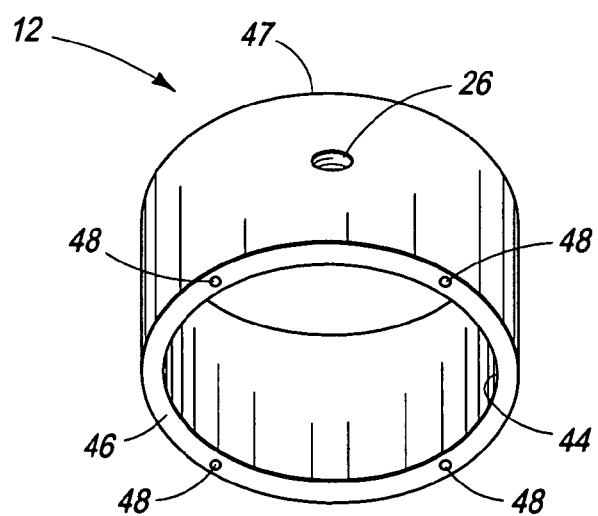
FIG. 4 is a top perspective view of a housing shell into which, the nozzle insert assembly is tightly fitted during assembly.

FIG. 4 is a perspective view of the housing shell 12, looking into the shell top end 46 opening. The shell inside diameter 44 is selected to produce a tight fit when the shell 12 is fitted on a nozzle insert assembly.

Four threaded holes 48 that are spaced equally apart, are cut in the top end 46 of the shell 12, for fastening to the mounting plate 4. A threaded hole 26 is located in the side of the shell for use as a port in attaching a blast air hose.

For device assembly, the distal end opening 47 of the shell 12 is pushed over the top end flange 32 of the nozzle insert assembly, and over the embedded "O" rings 22 until the shell end opening 47 edge is hard against the stepped flange 36 at the end of the nozzle insert assembly. The "O" rings pressure on the shell inner wall surface, holds the shell securely in place without need for fasteners.

Figure 5:
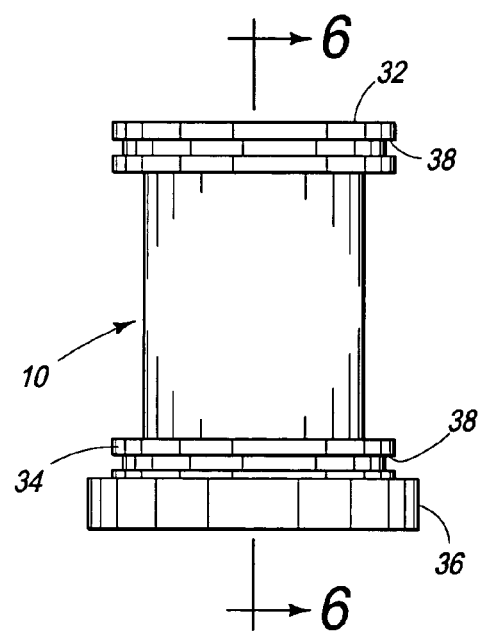
FIGS. 5, 6 and 7 are respectively: a side elevation view of a sleeve member of the nozzle insert assembly, an axial cross-section view taken along line 6-6 of FIG. 5, and a lower end plan view of the sleeve member.
Figure 6:
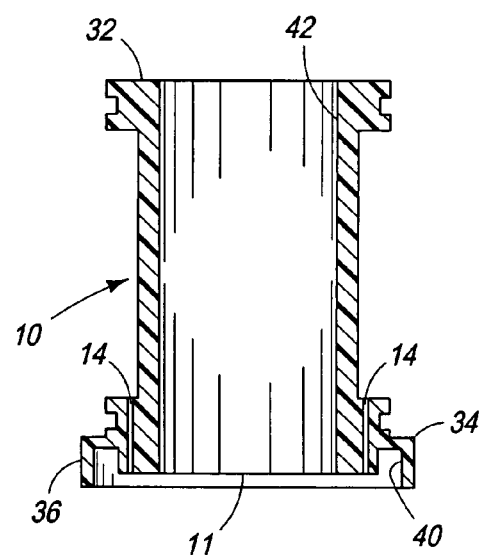
Figure 7:
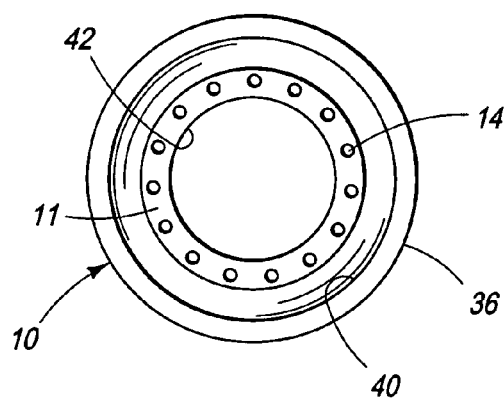

The above described features of the sleeve member 10 are shown in more detail in FIGS. 5, 6 and 7, which are respectively, a side elevation view, a cross-section elevation view taken along line 6-6 of FIG. 5, and a bottom end plan view.

As illustrated in FIGS. 6 and 7, the nozzle face 11 is an annular lip that is recessed and includes a large annular tamp ring groove 40. The nozzle face 11 is recessed to provide a sufficient separation between the plane of the Bernouilli generator air flow and the blast air exit holes 14 to avoid any air flow interaction. Such interaction is not likely to occur in normal use when the lifting and air-tamping activations are computer controlled.

The diameter of the axial central cavity 42 is sized to fit easily over a Bernouilli lift generator unit 16.

Refer now to FIGS. 8 and 9 which are respectively, a plan view and a side end view of a mounting plate 4 which is required for attaching the device to an operating machine. A large diameter hole 50 for insertion of the end of a high air pressure hose, is cut in the mounting plate 4. Concentrically positioned around the air pressure hose hole 50 are two rings of holes for fastening screws. These are: three holes 52 that are disposed to match a Bernouilli lift generator unit 16 fastening holes, and four equidistant holes 54 for use in fastening the device shell 12 to the mounting plate 4. Two slots 56 in the plate are shown for attaching the mounting plate 4 to a suitable operating machine.

FIGS. 10A, 10B and 11C are respectively, a top end view, a side elevation view, and a bottom end view of a commercially available Bernouilli lift generator unit 16. An approximate illustration of the internal construction of the lift generator unit 16 is given in FIG. 2 and is described herein. A threaded opening 66 to the generator axial inlet air tube, is provided in the generator top end 60, surrounded by three threaded holes 68 for fastening screws. The generator bottom end 64 defines a nozzle end, with a nozzle located at the center. Surrounding the nozzle is a circular recessed surface 18 for guiding the horizontal air flow from the nozzle.

It should be understood that the above drawings shown in FIGS. 10A, 10B and 10C describe only a particular, modified commercially available Bernouilli lift generator unit as an example. Other Bernouilli lift generator units, although generally cylindrical, may vary in size and shape, depending on their lift rating, or other consideration. These variations in size and shape would be accommodated in the design of invention lifting/air-tamping devices for different lift ratings.

Finally, refer to FIGS. 11A and 11B which are respectively, an end plan view and a side elevation view of a plastic spacing disk 15. This disk is sized to fit on top of the lift generator unit 16 between the generator and the mounting plate 4. Holes 70, 72 are cut vertically through the disk 15 to match the threaded openings in the top end of the generator 16, allowing screws to be inserted through the mounting plate, through the disk 15 and into the generator for fastening.

As can be seen from the drawings, the invention lift and air-tamping device is a simple, compact design. It has no moving parts to wear out, and there is no electrical wiring attached to the device, making the device explosion proof.

Due to the use of only positive, regulated high pressure air in small quantities for minute time periods, the device never clogs or ices up. The device is therefore highly reliable and safe to use, requiring no periodic servicing or cleaning.

The invention device may be used in handling many types of light weight items. Some examples of these items are:
Delicate items such as CDs and DVDs;
Electronic circuit boards with perforations;
Labels;
Paper and plastic bags; and
Dirty or dusty items.

The compact design and small size of the invention allows the device to be placed in tight quarters as compared with the spaces required for currently available devices. It is ideal for use with small delicate items that may be otherwise easily damaged.

A major advantage of the invention device is its fast on and off control response time (<1/100th sec.), allowing very short operating periods.

Another advantage of the invention is that it can be used in a very clean environment where contact with items to be lifted is prohibited, or used in a dusty environment without clogging.

Yet another advantage of the invention device is its high reliability, due to its few number of components and no moving parts.

From the foregoing description, it is believed that the described preferred embodiment achieves the objects of the present invention. Alternative embodiments and modifications will be apparent to those skilled in the art. These and other modifications are considered to be equivalent and within the spirit and scope of the present invention.

Having described the invention, what is claimed is:

1. A non-contact, air-activated lifting and tamping device, which comprises:
 (a) a mounting plate having planar parallel sides and having a first opening cut vertically through said plate, said first opening being sized to allow insertion of a high pressure air hose connector;
 (b) means for attaching said mounting plate to an automated operating machine;
 (c) an elongate metal housing shell which has a cylindrical axial cavity throughout with a smooth surfaced wall, said housing shell including a threaded second opening in said wall that is sized to engage a high pressure air hose connector, and to provide air hose access to said axial cavity;
 (d) means for fastening said housing shell to said mounting plate;
 (e) a nozzle insert assembly that is sized and shaped to fit axially inside said housing shell and create an annular air chamber between said shell and said assembly; said assembly comprising:
  an elongate tubular sleeve with a longitudinal central cavity extending throughout, having an annular first flange that extends radially outward at a top opening of said central cavity, and an annular stepped second flange that extends radially outward at a distal end of said sleeve around a bottom opening in said central cavity; said first flange including a circumferential deep first groove which is sized to seat an O-ring, said second flange also including a circumferential deep second groove for an O-ring, cut in a stepped portion of said second flange; said second flange including a multiplicity of small diameter passages that are cut longitudinally in said stepped portion to provide air flow exits for said air chamber; said passages being disposed spaced apart in a ring that is concentric with said bottom opening of said central cavity, said passages each having an exit opening in a horizontal annular surface of said second flange which surrounds said bottom opening; said annular surface being recessed in said second flange and including a wide, deep circumferential third groove which is sized for seating a tamp ring;
  two identical O-rings for seating in said first flange and said second flange; and
  a large diameter elastomer tamp ring for seating in said third groove in said second flange;
 (f) a Bernoulli type lift generator unit which has a diameter and length, sized and shaped to fit axially inside said central cavity in said nozzle insert assembly, said lift generator unit having an axial threaded opening in a top end for engaging the connector of a regulated, high pressure air hose;
 (g) a plastic spacing disk for placing on said top end of said lift generator unit as a spacer during assembly, said disk having a diameter that approximates the diameter of said lift generator unit, and including a center axial through hole that is sized for insertion therein of a high pressure air hose connector; and,
 (h) means for fastening said lift generator unit, through said spacing disk and to said mounting plate;
 said nozzle insert assembly being disposed tightly in said axial cavity of said housing shell with an end edge of said shell abutting a stepped portion of said second flange, and forming a closed annular chamber with lower exit air passages for high velocity air; said lift generator unit and said spacing disk being disposed axially in said central cavity of said nozzle insert assembly and fastened to said mounting plate;

said lifting and tamping device, when a regulated high pressure air hose is connected input to said lift generator unit and activated, and a second high pressure air hose is connected input to said housing shell, being able to produce a lifting force on an adjacent light weight item, sufficient to hold the item without the item contacting the device, said device also producing an air-tamping force caused by multiple jets of air exiting said device when said second high pressure air hose is activated.

2. The lifting and tamping device as defined in claim 1, wherein said means for attaching said mounting plate to an automated machine includes a plurality of longitudinal slots cut in the plate; said slots having a width sufficient for insertion of a fastening bolt.

3. The lifting and tamping device as defined in claim 1, wherein said means for fastening said housing shell to said mounting plate includes: a plurality of threaded first holes cut vertically and placed evenly spaced apart in an end edge of said housing shell;

a plurality of second holes in a pattern which matches that formed by said threaded first holes, cut in said mounting plate concentric with said first opening; and, a plurality of threaded screws for engaging said threaded first holes in said housing shell through said mounting plate, and fastening the housing shell to the mounting plate.

4. The lifting and tamping device as defined in claim 1, wherein said tubular sleeve member in said nozzle insert assembly, is fabricated using a molded plastic material.

5. The lifting and tamping device as defined in claim 1, wherein said means for fastening said lift generator unit, through said spacing disk to said mounting plate includes:

a plurality of threaded third holes cut vertically and placed symmetrically spaced apart, concentric with said axial threaded opening in said top end of said lift generator unit;

a plurality of fourth holes in a pattern which matches that formed by said threaded third holes, cut in said spacing disk concentric with said center axial through hole in said spacing disk; a plurality of fifth holes in a pattern which matches that formed by said threaded third holes of said lift generator unit, cut in said mounting plate concentric with said first opening; and, a plurality of threaded screws for engaging said threaded third holes in said lift generator unit through said spacing disk and through said mounting plate, fastening the lift generator unit to the mounting plate.

* * * * *